(12) United States Patent
Ramaswamy

(10) Patent No.: US 8,772,856 B2
(45) Date of Patent: Jul. 8, 2014

(54) CHARGE STORAGE NODES WITH CONDUCTIVE NANODOTS

(75) Inventor: Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 640 days.

(21) Appl. No.: 12/693,062

(22) Filed: Jan. 25, 2010

(65) Prior Publication Data

US 2011/0180865 A1     Jul. 28, 2011

(51) Int. Cl.
*H01L 29/788* (2006.01)
(52) U.S. Cl.
USPC ........ 257/317; 257/324; 257/321; 257/E29.3; 257/E29.304; 257/E29.17

(58) Field of Classification Search
USPC .............. 257/317, 324, 321, E29.3, E29.304, 257/E29.17
See application file for complete search history.

(56) References Cited

U.S. PATENT DOCUMENTS

| | | | |
|---|---|---|---|
| 7,173,304 B2 | 2/2007 | Weimer et al. | |
| 2007/0092989 A1 | 4/2007 | Kraus et al. | |
| 2007/0155103 A1* | 7/2007 | Shukuri | 438/267 |
| 2008/0035983 A1 | 2/2008 | Sandhu et al. | |
| 2009/0010072 A1* | 1/2009 | Tanaka et al. | 365/185.23 |
| 2009/0134451 A1 | 5/2009 | Baik et al. | |

* cited by examiner

*Primary Examiner* — Long Pham
(74) *Attorney, Agent, or Firm* — Dicke, Billig & Czaja, PLLC

(57) ABSTRACT

Memory cells formed to include a charge storage node having conductive nanodots over a charge storage material are useful in non-volatile memory devices and electronic systems.

20 Claims, 6 Drawing Sheets

CHARGE STORAGE NODES WITH CONDUCTIVE NANODOTS

TECHNICAL FIELD OF THE INVENTION

The present disclosure relates generally to semiconductor memories and, in particular, in one or more embodiments, the present disclosure relates to memory cells for non-volatile memory devices, the memory cells having charge storage nodes.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage nodes (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

As memory densities increase, issues with data retention, program saturation and trap-up tend to worsen. For example, while polysilicon charge storage nodes have been commonly used for years, they tend to become impracticable as their thickness becomes too thin, e.g., around 50 Å (5 nm). For the reasons stated above, and for other reasons stated below which will become apparent to those skilled in the art upon reading and understanding the present specification, there is a need in the art for alternative memory device architectures.

DETAILED DESCRIPTION OF THE INVENTION

Figure 1:
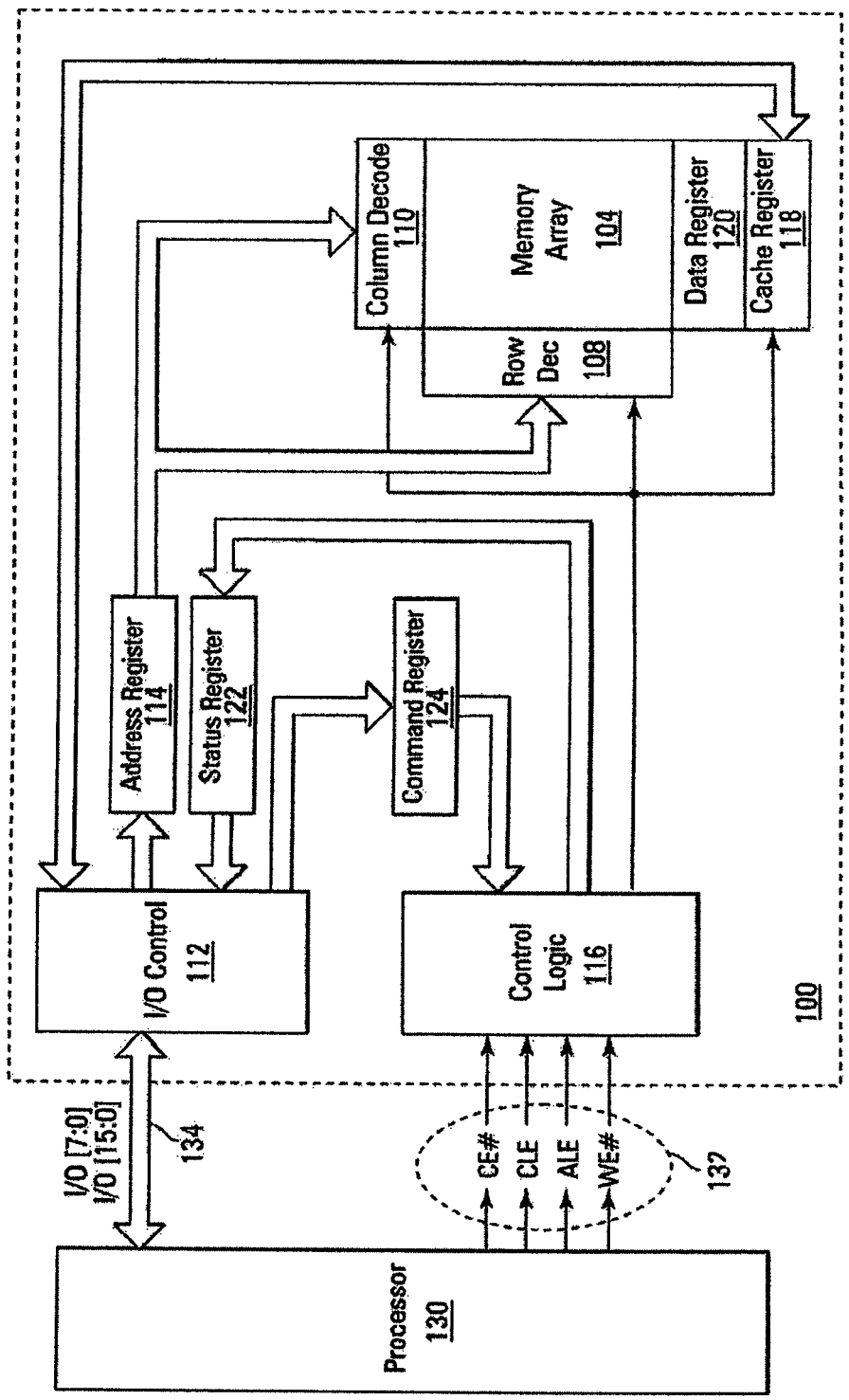
FIG. 1 is a simplified block diagram of a memory device coupled to a processor as part of an electronic system, according to an embodiment of the disclosure.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon on sapphire (SOS) technology, silicon on insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure. The following detailed description is, therefore, not to be taken in a limiting sense.

Various embodiments include memory cells having a charge storage node between a first dielectric, e.g., a tunnel dielectric, and a second dielectric, e.g., an intergate dielectric, and memory devices and systems including such memory cells. Memory cells of this type are often referred to as floating-gate memory cells or charge trap memory cells. Charge storage nodes of various embodiments include a charge storage material and conductive nanodots capable of storing a charge.

FIG. 1 is a simplified block diagram of a memory device 100, as one example of an integrated circuit device, in communication with (e.g., coupled to) a processor 130 as part of an electronic system, according to an embodiment of the disclosure. Some examples of electronic systems include personal computers, personal digital assistants (PDAs), digital cameras, digital media players, digital recorders, games, appliances, vehicles, wireless devices, cellular telephones and the like. The processor 130 may be, for example, a memory controller or other external processor for use in the control and access of the memory device 100.

Memory device 100 includes an array of memory cells 104 logically arranged in rows and columns. At least one memory cell of the array of memory cells 104 includes a charge storage node in accordance with an embodiment of the disclosure. Although various embodiments will be described primarily with reference to NAND memory arrays, the various embodiments are not limited to a specific architecture of the memory array 104. Some examples of other array architectures suitable for the present embodiments include NOR arrays, AND arrays or other arrays.

A row decode circuitry 108 and a column decode circuitry 110 are provided to decode address signals. Row decode circuitry 108 contains one or more transistors in accordance with embodiments of the disclosure. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

Specifically, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
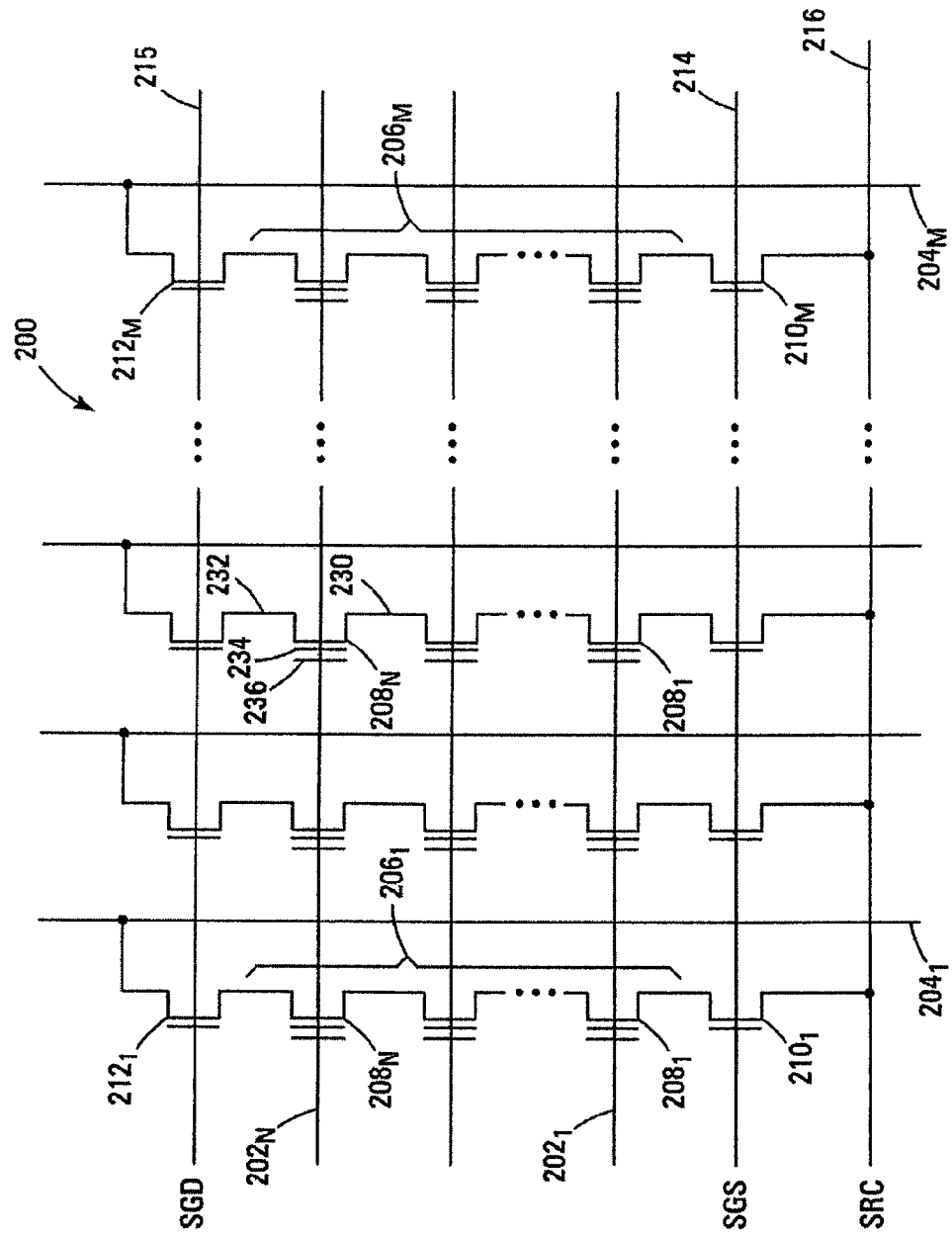
FIG. 2 is a schematic of a portion of an example NAND memory array as might be found in the memory device of FIG. 1.

FIG. 2 is a schematic of a NAND memory array 200, e.g., as a portion of memory array 104. Memory array 200 may be formed in a common conductively doped region (e.g., a common p-well) formed in a semiconductor.

As shown in FIG. 2, the memory array 200 includes access lines, commonly referred to as word lines (which may comprise commonly coupled control gates $202_1$ to $202_N$) and intersecting data lines, such as bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. At least one transistor 208 has a gate stack having a charge storage node in accordance with an embodiment of the disclosure. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234 as a charge storage node, and a control gate 236, as shown in FIG. 2. Floating-gate transistors 208 have their control gates 236 coupled to a word line 202 (e.g., the control gates may be commonly coupled to form a word line). A column of the floating-gate transistors 208 are those NAND strings 206 coupled to a given local bit line 204. A row of the floating-gate transistors 208 are those transistors commonly coupled to a given word line 202.

Figure 3A:
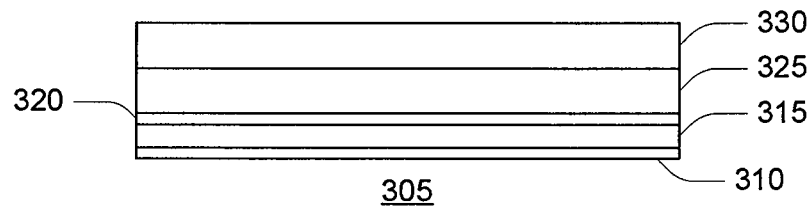
FIGS. 3A-3E depict a portion of a memory array during various stages of fabrication in accordance with an embodiment of the disclosure.

FIGS. 3A-3E depict a portion of a memory array during various stages of fabrication. FIG. 3A depicts a portion of a memory array after several processing steps have occurred. In general, FIG. 3A may depict a semiconductor 305 upon which portions of future gate stacks of non-volatile memory cells are formed. For one embodiment, the semiconductor 305 is a monocrystalline silicon. For a further embodiment, semiconductor 305 is a conductively-doped monocrystalline silicon. Other embodiments may include amorphous silicon, polycrystalline silicon (commonly referred to as polysilicon), or other semiconductor materials. Semiconductor 305 may be conductively doped to a first conductivity type, e.g., a p-type conductivity.

As further depicted in FIG. 3A, a tunnel dielectric 310, a charge storage node 315 having conductive nanodots in accordance with an embodiment of the disclosure, an intergate dielectric 320, a control gate 325 and a dielectric cap 330 have been formed on the semiconductor 305. These elements will form the gate stacks of future memory cells.

Formation of the structure of FIG. 3A can include formation of the tunnel dielectric 310 over an active region of the semiconductor 305, e.g., an area over which memory cells will be formed. For example, the active region of the semiconductor 305 may include a conductively-doped well of a semiconductor wafer. The tunnel dielectric 310 is generally one or more dielectric materials. The tunnel dielectric 310 might be formed, for example, by thermal oxidation of the semiconductor 305. Alternatively, the tunnel dielectric 310 could be formed by a blanket deposition of a dielectric material, such as by chemical vapor deposition (CVD), physical vapor deposition (PVD) or atomic layer deposition (ALD). Example dielectric materials for tunnel dielectric 310 include silicon oxides ($SiO_x$), silicon nitride ($SiN_x$), silicon oxynitrides ($SiO_xN_y$), aluminum oxides ($AlO_x$), hafnium oxides ($HfO_x$), hafnium aluminum oxides ($HfAlO_x$), lanthanum oxides ($LaO_x$), tantalum oxides ($TaO_x$), zirconium oxides ($ZrO_x$), zirconium aluminum oxides ($ZrAlO_x$), etc., and combinations thereof.

The charge storage node 315 is then formed over the tunnel dielectric 310. Formation of the charge storage node 315 will be described in more detail with reference to FIGS. 4A-4D. The charge storage node 315 will store a charge indicative of a data state of the future memory cells.

The intergate dielectric 320 is then formed over the charge storage node 315. The intergate dielectric 320 is generally one or more dielectric materials. For example, the intergate dielectric 320 may include one or more layers of dielectric materials including high-K dielectric materials. Example high-K dielectric materials for intergate dielectric 320 include aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), yttrium oxide ($Y_2O_3$), etc. For one embodiment, the intergate dielectric 320 includes an ozone-based formation of hafnium silicon oxide followed by water-based formation of hafnium oxide.

The control gate 325 is formed over the intergate dielectric 320. In general, the control gate 325 includes one or more conductive materials. For one embodiment, the control gate 325 contains a conductively-doped polysilicon. For another embodiment, the control gate 325 contains a metal-containing material. For a further embodiment, the control gate 325 includes a metal-containing material over polysilicon, e.g., a refractory metal silicide formed on a conductively-doped polysilicon. The metals of chromium (Cr), cobalt (Co), hafnium (Hf), molybdenum (Mo), niobium (Nb), tantalum (Ta), titanium (Ti), tungsten (W), vanadium (V), zirconium (Zr), and metal nitrides (including, for example, titanium nitride, tantalum nitride, tantalum carbon nitride, tungsten nitride) for metal gates are generally recognized as refractory metal materials. For another embodiment, the control gate 325 contains multiple metal-containing materials, e.g., a titanium nitride (TiN) barrier over the intergate dielectric 320, titanium (Ti) as an adhesion material over the barrier, and tungsten (W) over the adhesion material.

The dielectric cap 330 can be formed over the control-gate 230 to act as an insulator and barrier layer to protect the control gate 230 during subsequent processing. The dielectric cap 330 contains one or more dielectric materials and may include, for example, such dielectrics as silicon oxides ($SiO_x$), silicon nitride ($SiN_x$), and silicon oxynitrides ($SiO_xN_y$). For one embodiment, the dielectric cap 330 is a silicon nitride, formed, for example, by such methods as CVD. It is noted that additional layers may be used to form the gate stack, such as barrier materials to inhibit diffusion between opposing materials or adhesion materials to promote adhesion between opposing materials.

Figure 3B:
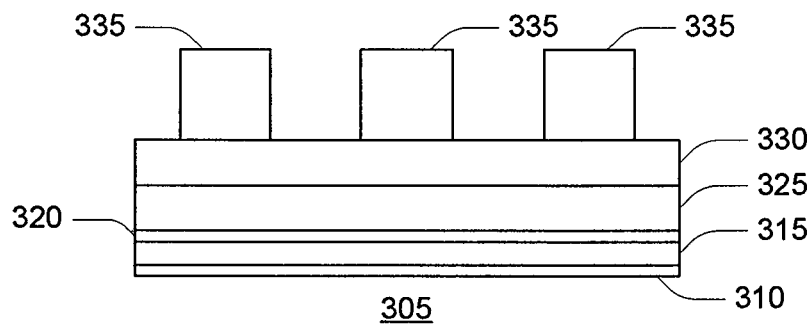

In FIG. 3B, a mask 335 is formed and patterned over the dielectric cap 330. As one example, a photolithographic resist material could be deposited as mask layer 335 overlying the dielectric cap 330, exposed to a radiation source, such as UV light, and developed to define areas overlying the dielectric cap 330 for removal.

Figure 3C:
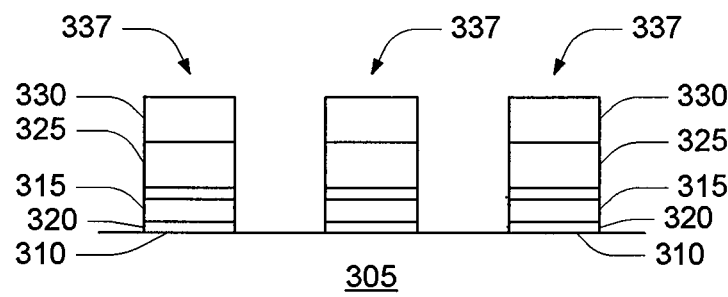

Following this patterning of the mask 335, exposed portions of the dielectric cap 330 and underlying portions are removed in FIG. 3C, such as by etching or other removal process, to expose the semiconductor 305. More than one removal process may be used where the chosen removal process is ineffective at removing an underlying material. Following removal, one or more gate stacks 337 for word lines are defined. Although FIGS. 3A-3E depict only memory cells, the select gates (not shown in FIGS. 3A-3E) may be formed of the same gate stacks 337, with the exception that the control gate 325 and charge storage node 315 would typically be shorted together to act as a single conductive entity.

Figure 3D:
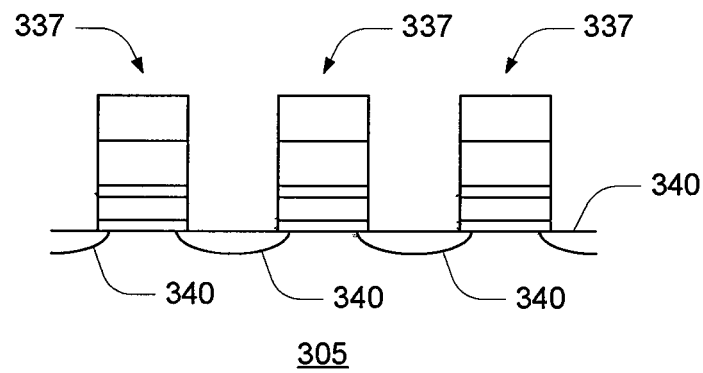

In FIG. 3D, source/drain regions 340 are formed generally adjacent the tunnel dielectric 310, such as by conductive doping of portions of the semiconductor 305 exposed in FIG. 3C. A channel region of a memory cell is defined by the area of the semiconductor 305 between the source/drain regions 340. Source/drain regions 340 will generally have a conductivity type different than the conductivity type of the semiconductor 305. The conductivity types may be opposites. For example, for a p-type semiconductor 305, the source/drain regions 215 might have an n+-type conductivity.

Figure 3E:
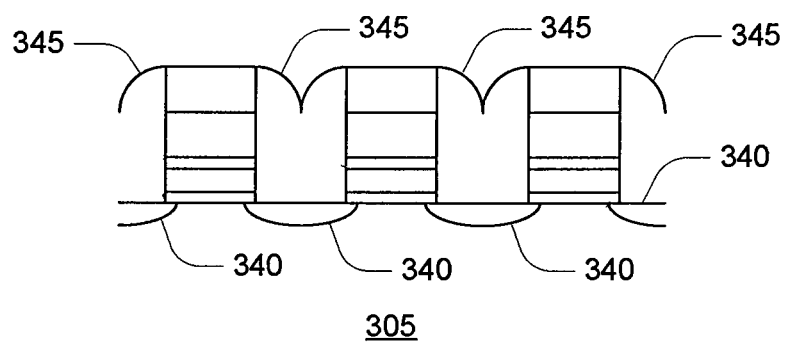

In FIG. 3E, dielectric spacers 345 may also be formed. As one example, a blanket deposit of some dielectric material, e.g., silicon nitride, is formed overlying the gate stacks 302, followed by an anisotropic removal of the blanket deposit to form the dielectric spacers 345. The resulting structure depicted in FIG. 3E includes series-coupled memory cells, such as those of a NAND string. However, it will be readily apparent that memory cells may be formed for an alternate array architecture using the gate stacks 337.

Figure 4A:
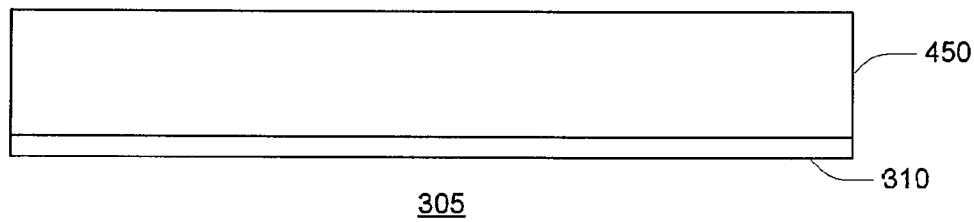
FIGS. 4A-4D depict a portion of a memory cell gate stack during various stages of fabrication of a charge storage node in accordance with an embodiment of the disclosure.

FIGS. 4A-4D depict a portion of a memory array during various stages of fabrication of a charge storage node in accordance with an embodiment of the disclosure. In FIG. 4A, a charge storage material 450 is formed over the tunnel dielectric 310 overlying the semiconductor 305. The charge storage material 450 is generally one or more materials capable of storing a charge. For one embodiment, the charge storage material 450 is a silicon-containing material. Examples include polysilicon, amorphous silicon and monocrystalline silicon. The charge storage material 450 may be an undoped or conductively doped material. For example, the charge storage material 450 might be a polysilicon material having a p-type conductivity. Conductively doping semiconductor materials, such as monocrystalline silicon, amorphous silicon and polysilicon, may be performed subsequent to formation or concurrent with formation.

For one embodiment, the charge storage material 450 has a thickness of approximately 10 Å to 100 Å (1 nm to 10 nm). For a further embodiment, the charge storage material 450 has a thickness of approximately 30 Å to 50 Å (3 nm to 5 nm). It is recognized that the variability of industrial fabrication will inherently produce minor variations in thickness such that a process seeking a particular thickness, e.g., 30 Å (3 nm), will likely produce thicknesses cell-to-cell that are above and below that particular value.

Figure 4B:
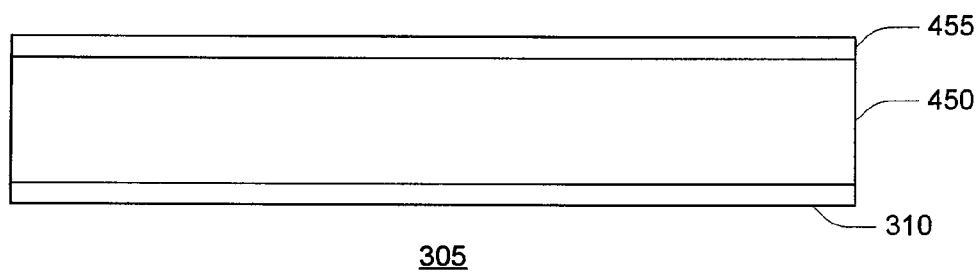

As depicted in FIG. 4B, an oxide 455 may be formed on the charge storage material 450. For example, where charge storage material 450 is a silicon-containing material, the oxide 455 might represent a native oxide formed on a surface of the silicon-containing material. Alternatively, the oxide 455 might represent an oxide formed on the silicon-containing material by such methods as thermal oxidation, CVD or PVD. For one embodiment, the oxide 455 has a thickness of approximately 5 Å to 10 Å (0.5 nm to 1 nm).

Figure 4C:
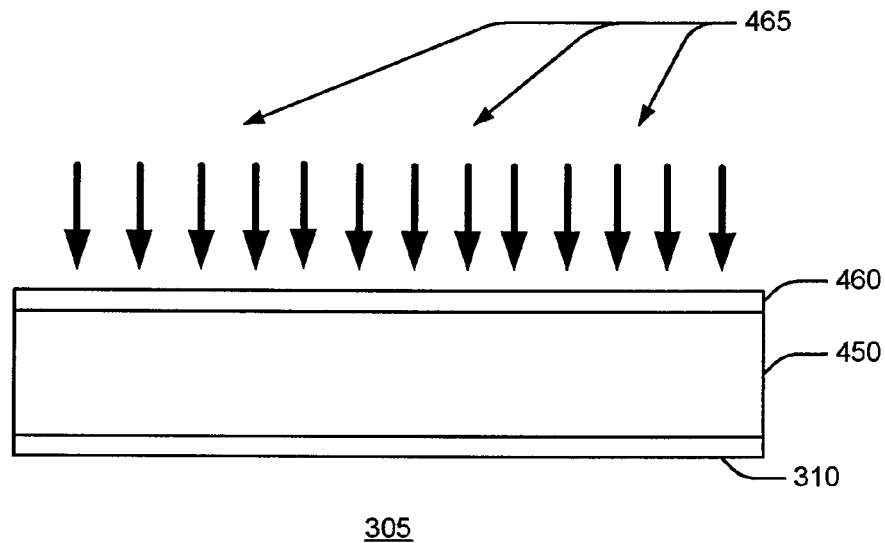
Figure 4D:
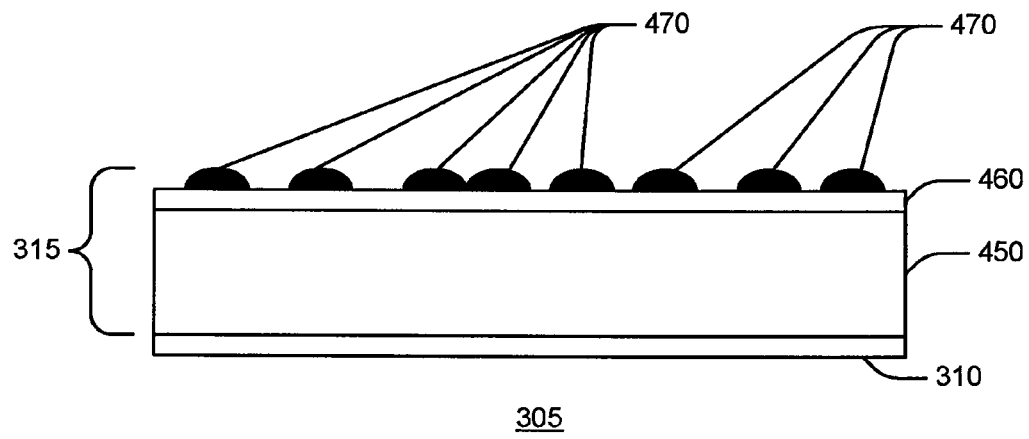

In FIG. 4C, the oxide 455, or alternatively, the surface of the charge storage material 450 if no oxide 455 is formed, may be nitridized. The nitridation is represented by arrows 465. The nitridation seeks to provide a barrier 460 between the charge storage material 450 and the subsequent formation of nanodots. For example, where charge storage material 450 is a silicon-containing material, the nitridation may form a barrier 460 of silicon oxynitride if an oxide 455 is formed, or form a barrier 460 of silicon nitride if no oxide 455 is formed. Such nitridation can serve to mitigate interaction of the future nanodots with either the barrier 460 or the charge storage material 450, e.g., to inhibit over silicidation of a silicon-containing barrier 460 or charge storage material 450. For one embodiment, the barrier 460 has a thickness of approximately 5 Å to 10 Å (0.5 nm to 1 nm). Some example processes for carrying out a nitridation include direct plasma nitridation and ammonia anneal.

For an alternate embodiment, a nitridized barrier 460 may be formed on the charge storage material 450 directly, such as a nitride or oxynitride formed on the charge storage material 450 by CVD, PVD or atomic layer deposition (ALD) without performing a nitridation of an oxide 455 or charge storage material 450. For example, a silicon-rich ALD silicon nitride may be formed as the barrier 460 on the charge storage material 450. Furthermore, the oxide 455 may serve directly as the barrier 460 without nitridation where the properties of the oxide 455 provide mitigation of interaction between the future nanodots and the charge storage material 450. Regardless of its form, e.g., an oxide, nitride, oxynitride or other material, the barrier 460 is generally some material chosen to provide mitigation of interaction between the charge storage material 450 and future nanodots. As such, the barrier 460 may be eliminated where interaction between the future nanodots and the charge storage material 450 is not a concern, for example if the two materials are non-reactive. For some embodiments, barrier 460 is a dielectric material In FIG. 4D, nanodots 470 are formed on the barrier 460. The nanodots 470 generally contain one or more conductive materials. For various embodiments, the nanodots 470 contain metal. For example, the nanodots 470 may represent elemental metals, e.g., titanium, tantalum, tungsten, ruthenium, rhodium, platinum, etc., or metal alloys thereof. Alternatively, the nanodots 470 may represent metal nitrides, e.g., titanium nitride, tantalum nitride, tungsten nitride, ruthenium nitride, rhodium nitride, platinum nitride, etc., metal silicides, e.g., titanium silicide, tantalum silicide, tungsten silicide, ruthenium silicide, rhodium silicide, platinum silicide, etc., or combinations of any of the foregoing. For example, titanium nanodots might be formed over a silicon-containing barrier, such as silicon oxynitride, and subsequent processing may form at least some titanium silicide through reaction between the titanium nanodots and silicon of the silicon-containing barrier or of an underlying silicon-containing charge storage material, such that the nanodots would contain at least elemental titanium and titanium silicide.

Nanodots 470 may be formed, for example, by CVD, ALD, PVD, etc. The nanodots 470 generally represent discrete formations of conductive material, e.g., metal-containing material, such that while some individual nanodots 470 may be adjoining one another, there will be portions of the barrier 460 (or charge storage material 450 where barrier 460 is eliminated) that will remain exposed between the nanodots 470, and the nanodots 470 will not form a contiguous conductive entity. Accordingly, if an integrate dielectric, such as dielectric 320, is formed over the nanodots 470, it may form on such exposed portions of the barrier 460 and/or charge storage material 450. For one embodiment, a density of the nanodots 470 is approximately $1E12/cm^2$ to $1E15/cm^2$. For a further embodiment, the density of the nanodots 470 is approximately $1E13/cm^2$. For one embodiment, the nanodots 470 have a thickness of approximately 20 Å+/−10 Å (2 nm+/−1 nm). Charge storage material 450, barrier 460 (if utilized) and nanodots 470 collectively define a charge storage node 315. Formation of a memory cell using the charge storage node 315 of FIG. 4D can proceed as described with reference to FIGS. 3A-3E.

CONCLUSION

Non-volatile memory devices have been described utilizing memory cells including a charge storage node having conductive nanodots over a charge storage material. This differs from prior memory cell structures having nanodots embedded within a charge storage material and provides a more distinct interface than forming the nanodots directly on a tunnel dielectric.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:
1. A memory cell, comprising:
a first dielectric over a semiconductor;
a charge storage node over the first dielectric;
a second dielectric over the charge storage node;
a control gate over the second dielectric; and
source/drain regions in the semiconductor generally adjacent the first dielectric;
wherein the charge storage node comprises a charge storage material and conductive nanodots; and
wherein the conductive nanodots are between the charge storage material and the second dielectric.

2. The memory cell of claim 1, further comprising a barrier between the conductive nanodots and the charge storage material.

3. The memory cell of claim 1, wherein the conductive nanodots have a density of 1E12/cm$^2$ to 1E15/cm$^2$.

4. The memory cell of claim 1, wherein the conductive nanodots comprise metal-containing nanodots.

5. The memory cell of claim 4, wherein the metal-containing nanodots comprise at least one metal-containing material selected from the group consisting of elemental metals, metal alloys, metal nitrides and metal silicides.

6. The memory cell of claim 5, wherein metals of the elemental metals, metal alloys, metal nitrides and metal silicides of the at least one metal-containing material are selected from the group consisting of titanium, tantalum, tungsten, ruthenium, rhodium, and platinum.

7. The memory cell of claim 1, wherein the charge storage material comprises a silicon-containing material.

8. The memory cell of claim 7, wherein the silicon-containing material is selected from the group consisting of monocrystalline silicon, amorphous silicon and polycrystalline silicon, and wherein the silicon-containing material is either undoped or conductively doped.

9. The memory cell of claim 7, further comprising a barrier between the charge storage material and the conductive nanodots, wherein the barrier comprises a dielectric material selected from the group consisting of an oxide, a nitride and an oxynitride.

10. A memory cell, comprising:
a tunnel dielectric over a semiconductor;
a silicon-containing charge storage material over the tunnel dielectric;
a nitridized barrier over the silicon-containing charge storage material;
metal-containing nanodots over the nitridized barrier;
an intergate dielectric over the metal-containing nanodots;
a control gate over the intergate dielectric; and
source/drain regions in the semiconductor generally adjacent the tunnel dielectric.

11. The memory cell of claim 10, wherein the silicon-containing charge storage material comprises polysilicon.

12. The memory cell of claim 11, wherein the polysilicon is conductively doped.

13. The memory cell of claim 10, wherein the metal-containing nanodots comprise at least one metal selected from the group consisting of titanium, tantalum, tungsten, ruthenium, rhodium, and platinum.

14. The memory cell of claim 10, wherein the nitridized barrier comprises a silicon oxynitride.

15. The memory cell of claim 10, wherein the silicon-containing charge storage material comprises polysilicon conductively doped to a p-type conductivity, wherein the nitridized barrier comprises a silicon oxynitride and wherein the metal-containing nanodots comprise elemental ruthenium.

16. The memory cell of claim 15, wherein the metal-containing nanodots further comprise ruthenium silicide.

17. A memory device, comprising:
an array of non-volatile memory cells; and
circuitry configured to control and/or access the array of non-volatile memory cells;
wherein at least one of the non-volatile memory cells comprises a charge storage node which comprises a charge storage material and conductive nanodots; and
wherein the conductive nanodots of the charge storage node are between the charge storage material and a control gate of the at least one of the non-volatile memory cells.

18. A memory device, comprising:
an array of non-volatile memory cells; and
circuitry configured to control and/or access the array of non-volatile memory cells;
wherein at least one of the non-volatile memory cells comprises a charge storage node which comprises a charge storage material and conductive nanodots;
wherein the conductive nanodots of the charge storage node are between the charge storage material and a control gate of the at least one of the non-volatile memory cells;
wherein the charge storage node further comprises a barrier between the charge storage material and the conductive nanodots;
wherein the charge storage material is a silicon-containing material selected from the group consisting of undoped or conductively doped monocrystalline silicon, undoped or conductively doped amorphous silicon and undoped or conductively doped polycrystalline silicon;
wherein the barrier is a silicon-containing dielectric material selected from the group consisting of a silicon oxide, a silicon nitride and a silicon oxynitride;
wherein the conductive nanodots comprise metal-containing nanodots comprising at least one metal-containing material selected from the group consisting of elemental metals, metal alloys, metal nitrides and metal silicides; and
wherein metals of the elemental metals, metal alloys, metal nitrides and metal silicides of the at least one metal-containing material are selected from the group consisting of titanium, tantalum, tungsten, ruthenium, rhodium, and platinum.

19. A memory device, comprising:
an array of non-volatile memory cells; and
circuitry configured to control and/or access the array of non-volatile memory cells;
wherein at least one of the memory cells comprises a gate stack having a tunnel dielectric over a semiconductor channel, a charge storage node over the tunnel dielectric, an intergate dielectric over the charge storage node and a control gate over the intergate dielectric, and wherein the charge storage node comprises a silicon-containing charge storage material, metal-containing nanodots and a silicon-containing barrier between the silicon-containing charge storage material and the metal-containing nanodots.

20. The memory device of claim 19, wherein the silicon-containing charge storage material comprises a conductively-doped polycrystalline silicon, wherein the silicon-containing dielectric barrier comprises a silicon oxynitride and wherein the metal-containing nanodots comprise ruthenium.

* * * * *